United States Patent

Kayama

Patent Number: 5,520,994
Date of Patent: May 28, 1996

[54] LAMINATED CARRIER FILM FOR USE IN CERAMIC GREEN SHEET

[75] Inventor: Kazuo Kayama, Sagamihara, Japan

[73] Assignee: Murata Manufacturing Co., Ltd., Kyoto, Japan

[21] Appl. No.: 340,419

[22] Filed: Nov. 15, 1994

[30] Foreign Application Priority Data

Nov. 18, 1993 [JP] Japan ..................................... 5-289278

[51] Int. Cl.⁶ ............................ B23B 27/32; B23B 27/36
[52] U.S. Cl. .......................... 428/215; 428/325; 428/430; 428/431; 428/483; 428/689; 428/910
[58] Field of Search ...................................... 428/689, 325, 428/215, 430, 431, 483

[56] References Cited

U.S. PATENT DOCUMENTS

| 5,019,200 | 5/1991 | Kawabata | 156/245 |
| 5,242,867 | 9/1993 | Lin et al. | 501/32 |
| 5,316,602 | 5/1994 | Kogame et al. | 264/40.1 X |

FOREIGN PATENT DOCUMENTS 0348310  12/1989  European Pat. Off. .

OTHER PUBLICATIONS

Patent Abstracts of Japan, vol. 015, No. 452 (M–1180) & JP–A–03 193 441 (Taiyo Yuden Co. Ltd.) 23 Aug. 1991.
Database WPI, Week 9348, Derwent Publications Ltd., London, GB; AN 93–382738 & JP–A–5 286 084 (Toray Ind Inc.) 2 Nov. 1993.
English Language Abstract of Japanese Laid–Open Application No. 5–253,913 (Oct. 5, 1993).
English Language Abstract of Japanese Laid–Open Application No. 2–252,225 (Oct. 11, 1990).

*Primary Examiner*—P. C. Sluby
*Attorney, Agent, or Firm*—Ostrolenk, Faber, Gerb & Soffen

[57] ABSTRACT

A laminated carrier film for use in a ceramic green sheet, (A) which comprises a core layer formed of an addition polymer, two support layers formed of a polyester and mounted at the side of both surfaces of the core layer, and two release layers laminated on outer surfaces of the two support layers, and (B) in which at least one of two adhesions between the core layer and the two support layers is 0.8 to 8 g/25 mm.

13 Claims, No Drawings

LAMINATED CARRIER FILM FOR USE IN CERAMIC GREEN SHEET

DETAILED DESCRIPTION OF THE INVENTION

This invention relates to a laminated carrier film for use in a ceramic green sheet. More specifically, this invention relates to a laminated carrier film which is useful for simultaneously producing two thin ceramic green sheets.

A ceramic green sheet which is used for the production of a multilayered ceramic substrate, a laminated ceramic capacitor, etc. is generally produced as follows. That is, a container with a doctor blade is mounted on a carrier film formed of a plastic film (e.g., a polyester film, a polypropylene film and a polymethylpentene film) alone or a carrier film in which a silicone coating is formed on one surface of said film. A predetermined amount of a slurry (slip) containing a ceramic powder, a plasticizer, a binder and the like is then injected into the container. When the carrier film is moved in a fixed direction, a green sheet (undried) having a thickness corresponding to a clearance between the doctor blade and the film is continuously formed on the carrier film. When the green sheet is dried with hot air or through an infrared heater, a complete green sheet is formed. In this method, since mechanical characteristics, flatness and the like of the carrier film can be utilized in the taking up of the green sheet and in the post treatments such as electrode printing and cutting, there is an advantage that the green sheet can be thinned. However, said method involves problems such as a low productivity and a high cost.

On the other hand, in order to improve the productivity of the ceramic green sheet, a dipping method is also used which comprises dipping a carrier film in a container containing a slurry composed of a ceramic powder, a plasticizer, a binder and the like, levelling the slurry coated on both surfaces of the carrier film in drawing it up to have a fixed thickness, using a quantitative comma roll or the like, and then drying the resulting coated film with hot air or through an infrared heater to form a green sheet. However, in this method it is required to peel off the green sheet from the carrier film at an outlet of a drier and to take up only the green sheet, and a strength or a flatness of the green sheet per se is utilized in the subsequent treatments such as electrode printing and cutting. Accordingly, there are problems that it is difficult to thin the green sheet which can scarcely respond to the recent requirement of thinning the green sheet.

It is an object of this invention to provide a laminated carrier film for use in a ceramic green sheet.

Another object of this invention is to provide a laminated carrier film for use in a ceramic green sheet which is suited to produce a thin green sheet with a high productivity.

Still another object of this invention is to provide a laminated carrier film for use in a ceramic green sheet which is useful for simultaneously producing two thin ceramic green sheets.

A further object of this invention is to provide a laminated carrier film for use in a ceramic green sheet which is easily peeled off from the laminated surface, and which is suited to produce a green sheet by a dipping method.

The other objects and advantages of this invention will be made clear from the following explanation.

In accordance with this invention, the above objects and advantages of this invention can be achieved by a laminated carrier film for use in a ceramic green sheet, (A) which comprises a core layer formed of an addition polymer, two support layers formed of a polyester and mounted at the side of both surfaces of the core layer, and two release layers laminated on outer surfaces of the two support layers, and (B) in which at least one of two adhesions (peel strength) between the core layer and the two support layers is 0.8 to 8 g/25 mm.

Examples of the addition polymer constituting the core layer in this invention include polyethylene, polypropylene, poly-4-methylpentene-1, polyvinyl chloride and polyvinylidene chloride. Of these, polyethylene is most preferable from the aspects of lamination characteristics and mechanical characteristics.

The thickness of the core layer is preferably 2 to 50 µm, more preferably 10 to 40 µm.

As the polyester constituting the two support layers mounted at the side of both surfaces of the core layer, a polyester comprising an alkylene terephthalate and/or an alkylene naphthalate as main component(s) is preferably used.

Preferable examples of the polyester include polyethylene terephthalate, polypropylene terephthalate, polybutylene terephthalate, polyethylene-2,6-naphthalate, and a polymer in which at least 80 mol % of the whole dicarboxylic acid component is terephthalic acid and/or 2,6-naphthalenedicarboxylic acid and at least 80 mol % of the whole glycol component is polymethylene glycol having 2 to 6 carbon atoms. On that occasion, the dicarboxylic acid which occupies not more than 20 mol % of the whole acid component is an aromatic dicarboxylic acid other than terephthalic acid and/or 2,6-naphthalenedicarboxylic acid. Examples of such aromatic dicarboxylic acid include isophthalic acid, biphenyldicarboxylic acid, diphenyl ether dicarboxylic acid, diphenylethane dicarboxylic acid, diphenylsulfonedicarboxylic acid, and diphenyl ketone dicarboxylic acid; aliphatic dicarboxylic acids such as adipic acid, and sebacic acid; and alicyclic dicarboxylic acids such as cyclohexane-1,4-dicarboxylic acid. Examples of the glycol other than the main glycol, which occupies not more than 20 mol % of the whole glycol component, include ethylene glycol, trimethylene glycol, tetramethylene glycol, pentamethylene glycol, hexamethylene glycol, and decamethylene glycol; alicyclic glycols such as cyclohexane dimethanol; aromatic diols such as hydroquinone, resorcin, and 2,2-bis(4-hydroxyphenyl)propane; aliphatic diols having an aromatic ring, such as 1,4-dihydroxymethylbenzene; and polyalkylene glycols (polyoxyalkylene glycols) such as polyethylene glycol, polypropylene glycol, and polytetramethylene glycol.

The polyester in this invention also includes a polyester containing a component derived from a hydroxycarboxylic acid, e.g., an aromatic hydroxy acid such as hydroxybenzoic acid or an aliphatic hydroxy acid such as ω-hydroxycaproic acid, in an amount of 20 mol % or less based on the total amount of the dicarboxylic acid component and the hydroxycarboxylic acid component.

Further, the polyester in this invention includes a copolymer comprising a component derived from a trifunctional or higher polycarboxylic acid or polyhydroxy compound such as trimellitic acid or pentaerythritol in such an amount that the polyester is substantially linear, e.g., 2 mol % or less based on the total amount of the acid components.

Said polyester is known per se and can be produced by a method known per se.

The above polyester has an intrinsic viscosity, measured at 35° C. in a solution of o-chlorophenol, of preferably about 0.4 to 0.8, more preferably 0.5 to 0.7, especially preferably 0.55 to 0.65.

Such a polyester can contain additives to improve properties of a film. For example, inorganic particles of calcium carbonate, kaolin, silicon oxide or barium sulfate or precipitated particles formed from a residue of a catalyst used to form the polyester are incorporated to form fine protrusions on the surface of the film or improve a lubricity of the film. Further, it is possible to contain an antistatic agent such as sodium dodecylsulfonate, and a pigment such as $TiO_2$ or $SiO_2$ as a hue adjusting agent. A polyester not containing such additives is naturally available.

The support layer formed of this polyester is preferably a biaxially oriented polyester film. The biaxially oriented polyester film can be produced by a method known so far, for example, by drying the polyester, then melting the dried polyester, extruding the melt onto a rotary cooling drum from a die (for example, a T-die or an I-die), rapidly cooling the extrudate to form an unstretched film, and biaxially stretching the unstretched film, followed by thermosetting. The thickness of the film is not particularly limited; it is preferably 2 to 100 μm.

The two support layers can be directly mounted on both surfaces of the core layer, or indirectly mounted on the surface of the core layer via other layers present on the surfaces of the core layer.

The laminated carrier film of this invention has two release layers on the respective outer surfaces of the two support layers.

The release layer in this invention is preferably a silicone release layer. The release layer can be roughly grouped into a release layer to an organic solvent-based ceramic slurry and a release layer to an aqueous ceramic slurry.

In the formation of the release layer to the organic solvent-based ceramic slurry, it is advisable to use, as a release agent, a thermosetting silicone composed mainly of dimethylpolysiloxane (e.g., KS-776 and KS-847 supplied by The Shin-etsu Chemical Industry Co., Ltd., and TPR-6700 supplied by Toshiba Silicone K.K.).

In the formation of the release layer to the aqueous ceramic slurry, it is advisable to use, as a release agent, a silicone release agent comprising dimethyl polysiloxane and silica fine particles contained therein (e.g., SD-7230 and SD-7320 supplied by Toray Dow Corning Silicone K.K.) or a modified silicone obtained by adding 1 to 10% by weight of dimethyl polysiloxane having a phenyl-substituted alkyl group at the terminal of the polymer to a mixture of an alkyd resin and a melamine resin (e.g., X-62-9022, KS-883 and KS-881 supplied by The Shin-etsu Chemical Industry Co., Ltd.), in order to improve wetting properties of the surface.

The release agent can be coated on the surface of the support layer(s) formed of the polyester by spin coating, spray coating, bar coating, gravure coating, reverse coating or comma coating. It is advisable to conduct the coating such that the dried film has a thickness of 0.05 to 1.0 μm.

The carrier film of this invention has a structure that as described above, the polyester layers are mounted at the side of both surfaces of the core layer and the release layers are further laminated on the polyester layers. At least one of two adhesions between the core layer and the two support layers is 0.8 to 8 g/25 mm, preferably 2 to 6 g/25 mm. The adhesion is measured as a peel strength and shown by the value of the peel strength. When the adhesion is lower than 0.8 g/25 mm, the support layer is liable to be peeled off from the core layer during the handling of the carrier film. On the other hand, when the adhesion is higher than 8 g/25 mm, the support layer can hardly be peeled off from the core layer in a state where the green sheet has been formed on the release layer, which is undesirable. In general, it is advisable that the adhesion (peel strength) between the core layer and the support layer is lower by at least 1 g/25 mm than the adhesion (peel strength) between the release layer and the green sheet.

It is advisable that both of two adhesions between the core layer and the two support layers are 0.8 to 8.0 g/25 mm. As to the value of the adhesion, at least one of two adhesions between the core layer and the two support layers is 1 to 8 g/25 mm.

It is easily understandable that when the support layer is indirectly mounted on the surface of the core layer via other layer, the adhesion between the core layer and the support layer can be replaced with either the adhesion between the core layer and other layer or the adhesion between the support layer and other layer.

The carrier film of this invention can be produced as follows, for example.

First, a coating solution of a release agent is coated on one surface of a biaxially oriented polyester film, and then dried to form a polyester film (release film) having the release layer laminated on one surface thereof. Then, two such release films are used. An addition polymer is coated on the reverse surface (non-release surface) of one of the above two release films and dried, and the other release film is adhered to the dried, coated surface such that the release surface of the film is arranged outside, to form a carrier film. The thus-formed carrier film has usually a difference in adhesion to the core layer between the two polyester film layers.

In the other method, the above two release films are used. An addition polymer is melt-extruded onto a reverse surface (non-release surface) of one of the release films for lamination. Immediately thereafter, the other release film is adhered to the laminated surface such that the release surface of the film is arranged outside, and the laminate is then cooled to form a carrier film. Said carrier film has usually no difference in adhesion to the core layer between the two polyester film layers. In this method, the adhesion between the core layer and the polyester film layers can be controlled by the molecular weight of the addition polymer of the core layer or the melt-extrusion temperature. For example, when the core layer is formed of polyethylene, it is advisable that polyethylene is melt-extruded at a temperature of 250° to 260° C. and laminated onto the reverse surface of the polyester film. When the extrusion temperature is too high, the adhesion (peel strength) tends to increase. On the other hand, when the extrusion temperature is too low, the adhesion (peel strength) tends to decrease. Further, when polyethylene is of a low molecular weight, the adhesion to the polyester layer increases. On the other hand, when polyethylene is of a high molecular weight, the adhesion to the polyester layer decreases.

The whole thickness of the carrier film of this invention is preferably 25 to 150 μm.

Examples of the ceramic slurry which is coated on the carrier film of this invention include an organic solvent-based slurry containing barium titanate, polyvinyl butyral and toluene-ethanol as a solvent, and a water-based slurry containing barium titanate, a water-soluble acrylic resin and starch.

The ceramic slurry is generally coated on both surfaces of the carrier film as follows. The carrier film is dipped in a container containing the ceramic slurry, and then the ceramic slurry excessively coated on the carrier film is levelled with a metallic bar or a doctor blade to a uniform coating thickness while drawing up the carrier film. The thus-obtained carrier film is dried with a drier to evaporate the solvent, whereby a green sheet is obtained.

The obtained green sheet is for example, separated from both surfaces of the core layer at the outlet of the drier to form two green sheets each of which is supported by each of the two carrier films. Or the green sheet is once taken up at the outlet of the drier and separated again from both surfaces of the core layer to form two green sheets each of which is supported by each of the two carrier films.

Since the carrier film of this invention undergoes, as stated above, the step of coating the ceramic slurry, the drying step, the peeling step and the taking-up step, it has, needless to say, the mechanical characteristics required of these steps. At this time, it is preferred that the polymer layer as the core layer is as thin as possible and as soft as possible. A hard rigid polymer layer is peeled off from the core layer during the use, and the film becomes unusable. This is undesirous.

It is understandable that as stated above, this invention provides also a ceramic green sheet on a carrier film comprising the laminated carrier film of this invention and the two ceramic green sheet layers laminated on the two release layers of the laminated carrier film.

On that occasion, it is advisable that the adhesion between the release layer of the laminated carrier film and the ceramic green sheet layer is equal to, or a bit higher by at least 1 g/25 mm than, the adhesion between the core layer and the support layer of the laminated carrier film.

In accordance with this invention, there can be provided a carrier film useful for simultaneously producing two high-performance thin ceramic green sheets. This ceramic green sheet is advantageously formed into, for example, ceramic electronic parts by printing an electrode on its surface, and conducting lamination and sintering.

This invention will be illustrated in more detail by referring to the following Examples and Comparative Example.

EXAMPLE 1

(1) A thermosetting silicone (KS-847, a trade name for a product of The Shin-etsu Chemical Industry Co., Ltd.) was coated on one surface of a polyester film (Tetron Film S, a trade name for a product made by Teijin Limited - 25 μm) to a dry thickness of 0.2 μm to form a release film whose one surface was subjected to the release treatment.

A high-density polyester (density 0.956 g/cc; MI8.5, a trade name for a product of Mitsubishi Chemical Industries Ltd.) was extruded on the reverse surface (non-release surface) of the release film to a thickness of 25 μm at a molten resin temperature of 250° to 260° C. Then, the reverse surface of the other release film was quickly contacted with the polyester film and adhered thereto with a cooling pressure roll to obtain a laminate having the release layers on both surfaces (carrier film). The peel strength between the polyester surface and the polyethylene surface of the laminate was 2 g/25 mm to 3 g/25 mm.

(2) A ceramic slurry was prepared by charging 100 parts by weight of a ceramic powder of barium titanate, 12 parts by weight of polyvinyl butyral, 8 parts by weight of dibutyl phthalate and 20 parts by weight of toluene-ethyl alcohol in a ball mill and thoroughly kneading them.

The thus-obtained slurry was charged in the container and the above laminated film was dipped therein. Then, while drawing up the film whose both surfaces had been coated with the slurry, the surfaces of the film were levelled with a metallic bar, and dried at 100° C. for 4 minutes to obtain a ceramic green sheet.

The green sheet was smoothly peeled off between the polyester film layers and the polyethylene layer to give two green sheets with the polyester films. The peel strength between the ceramic green sheet and the release layer surface was 5 g/25 mm to 6 g/25 mm.

EXAMPLE 2

(1) A modified silicone (X-62-9022, a trade name for a product of The Shin-etsu Chemical Industry Co., Ltd.) was coated on one surface of a polyester film (Tetron Film S, a trade name for a product of Teijin Limited - 25 μm) to a dry thickness of 0.2 μm to prepare a release film whose one surface was subjected to the release treatment.

A high-density polyethylene (density 0.918 g/cc; MI6.5, a trade name for a product of Unitika Ltd.) was extruded on the reverse surface (non-release surface) of the release film to a thickness of 25 μm at a molten resin temperature of 250° to 260° C. Then, the reverse surface of the other release film was quickly contacted with the film and adhered thereto with a cooling pressure roll to obtain a laminate having the release layers on both surfaces (carrier film). The peel strength between the polyester surface and the polyethylene surface of the laminate was 5 g/25 mm to 6 g/25 mm.

(2) A ceramic slurry was prepared by charging 100 parts by weight of barium titanate, 12 parts by weight of a water-soluble acrylic polymer, 8 parts by weight of polyethylene glycol and water in a ball mill and thoroughly kneading them.

The thus-obtained slurry was charged in the container and the above laminated film was dipped therein. Then, while drawing up the film whose both surfaces had been coated with the slurry, the surfaces of the film were levelled with a metallic bar, and dried to obtain a ceramic green sheet.

The green sheet was smoothly peeled off between the polyester film layers and the polyethylene layer to give two green sheets with the polyester films. The peel strength between the ceramic green sheet and the release layer surface was 12 g/25 mm.

COMPARATIVE EXAMPLE 1

Example 2 was repeated except that when a low-density polyethylene was extruded on the reverse surface of the film whose one surface was subjected to the release treatment as in Example 2, the molten resin temperature was 320° C. At this time, the peel strength between the polyester surface and the polyethylene surface was 10 g/25 mm.

A ceramic slurry was coated on the laminate in the same manner as in Example 2, and dried to obtain a green sheet.

When the green sheet was peeled off between the polyester film layer and the polyethylene layer, the delamination occurred in many portions between the green sheet and the polyester film surface, and the post treatment was impossible.

What we claim is:

1. A laminated carrier film for use in a ceramic green sheet, (A) which comprises a core layer formed of an addition polymer, two support layers formed of a polyester and mounted at the side of both surfaces of the core layer, and two release layers laminated on outer surfaces of the two support layers, and (B) in which at least one of two adhesions, in terms of peel strength, between the core layer and the two support layers is 0.8 to 8 g/25 mm.

2. The laminated carrier film of claim 1 wherein the addition polymer of the core layer is selected from the group consisting of polyethylene, polypropylene, poly-4-methylpentene-1, polyvinyl chloride and polyvinylidene chloride.

3. The laminated carrier film of claim 1 wherein the support layer is formed of an aromatic polyester in which a main dicarboxylic acid component is terephthalic acid or 2,6-naphthalenedicarboxylic acid and a main glycol component is polymethylene glycol having 2 to 6 carbon atoms.

4. The laminated carrier film of claim 1 wherein the release layer is formed of a silicone resin.

5. The laminated carrier film of claim 1 wherein the two support layers formed of the polyester are directly mounted on both surfaces of the core layer.

6. The laminated carrier film of claim 1 wherein both of the adhesions, in terms of peel strength, between the core layer and the two support layers are 0.8 g/25 mm to 8.0 g/25 mm.

7. The laminated carrier film of claim 1 wherein at least one of two adhesions, in terms of peel strength, between the core layer and the two support layers is 1 to 8 g/25 mm.

8. The laminated carrier film of claim 1 wherein the thickness of the core layer is 2 to 50 µm.

9. The laminated carrier film of claim 1 wherein the thickness of the support layer is 2 to 100 µm.

10. The laminated carrier film of claim 1 wherein the thickness of the release layer is 0.05 to 1 µm.

11. The laminated carrier film of claim 1 which has the whole thickness of 25 to 150 µm.

12. A ceramic green sheet on a carrier film comprising the laminated carrier film of claim 1 and two ceramic green sheet layers laminated on the two release layers of the laminated carrier film.

13. The ceramic green sheet on the carrier film of claim 12 wherein the adhesion, in terms of peel strength, between the release layer of the laminated carrier film and the ceramic green sheet layer is higher by at least 1 g/25 mm than the adhesion, in terms of peel strength, between the core layer and the support layer of the laminated carrier film.

* * * * *